(12) United States Patent
Entwistle (10) Patent No.: US 11,606,868 B2
(45) Date of Patent: Mar. 14, 2023

(54) DISPLAY UNIT

(71) Applicant: Urben Technologies Limited, St. Albans (GB)

(72) Inventor: Michael Entwistle, St. Albans (GB)

(73) Assignee: URBEN TECHNOLOGIES LIMITED, St. Albans (GB)

( * ) Notice: Subject to any disclaimer, the term of this patent is extended or adjusted under 35 U.S.C. 154(b) by 0 days.

(21) Appl. No.: 17/389,522

(22) Filed: Jul. 30, 2021

(65) Prior Publication Data

US 2022/0039268 A1 Feb. 3, 2022

(30) Foreign Application Priority Data

Aug. 3, 2020 (GB) ...................................... 2012039

(51) Int. Cl.
*H05K 5/00* (2006.01)
*H05K 5/02* (2006.01)

(52) U.S. Cl.
CPC ......... *H05K 5/0017* (2013.01); *H05K 5/0217* (2013.01)

(58) Field of Classification Search
CPC .............. H05K 5/0017; G09F 15/0012; G09F 2007/1843; G09F 7/10; G09F 15/0018; G09F 9/3026; A47F 5/0846; E04B 2/7407; G09G 2300/026
See application file for complete search history.

(56) References Cited

U.S. PATENT DOCUMENTS

| | | | |
|---|---|---|---|
| 4,630,386 A | 12/1986 | Wilson |
| 4,907,388 A | 3/1990 | Siahatgar |
| 5,024,030 A | 6/1991 | Morrison |
| 5,101,423 A | 3/1992 | Okamoto et al. |

(Continued)

FOREIGN PATENT DOCUMENTS

| CN | 2431388 Y | 5/2001 |
|---|---|---|
| CN | 101025875 A | 8/2007 |

(Continued)

OTHER PUBLICATIONS

Examination Report for United Kingdom Patent Application No. GB2012039.0, dated Jan. 26, 2021, 4 pages.

(Continued)

*Primary Examiner* — Hung S Bui
*Assistant Examiner* — Sagar Shrestha
(74) *Attorney, Agent, or Firm* — Withrow & Terranova, P.L.L.C.; Vincent K. Gustafson (57) ABSTRACT

The present invention provides a display unit comprising a front face and a peripheral frame, the peripheral frame forming a border around the front face, the front face comprising at least one display panel, wherein the peripheral frame comprises an extruded main section having a channel formed therein extending longitudinally along its length, the peripheral frame further comprising at least one extruded auxiliary section having a profile in cross-section which engages with the channel in the main section of the peripheral frame, wherein the auxiliary section of the peripheral frame provides an infill between the main section and the front face of the display unit to permit alternative or replacement display panels to be accommodated within the same peripheral frame.

16 Claims, 9 Drawing Sheets

(56) References Cited

U.S. PATENT DOCUMENTS

| | | | |
|---|---|---|---|
| 5,377,434 A | 1/1995 | Wilson | |
| 5,746,035 A | 5/1998 | Seiber et al. | |
| 5,826,385 A | 10/1998 | Dykstra et al. | |
| 6,141,926 A * | 11/2000 | Rossiter | E04B 2/7425 52/239 |
| 6,230,445 B1 | 5/2001 | Arko et al. | |
| 6,279,278 B1 | 8/2001 | Morris et al. | |
| 6,311,441 B1 | 11/2001 | Beavers et al. | |
| 6,823,618 B2 * | 11/2004 | Huang | G09F 13/0413 40/575 |
| 8,033,759 B2 | 10/2011 | Davidsaver et al. | |
| 8,365,449 B2 * | 2/2013 | Gimpel | G09F 15/0068 40/605 |
| 8,578,641 B2 * | 11/2013 | Suciu | G09F 3/20 40/792 |
| 9,549,482 B2 | 1/2017 | Podemski et al. | |
| 10,455,956 B1 | 10/2019 | Allen et al. | |
| 10,636,334 B2 | 4/2020 | Entwistle | |
| 10,813,478 B2 * | 10/2020 | Spiro | G09F 15/0012 |
| 10,854,119 B2 | 12/2020 | Entwistle | |
| 2006/0227003 A1 | 10/2006 | Ven | |
| 2008/0047182 A1 * | 2/2008 | Uccello, III | G09F 15/0012 40/591 |
| 2008/0074349 A1 | 3/2008 | Hong | |
| 2008/0259573 A1 * | 10/2008 | Besserer | G09F 15/0012 361/724 |
| 2010/0263251 A1 * | 10/2010 | Pitcher | G09F 7/18 40/768 |
| 2011/0069471 A1 | 3/2011 | Higson | |
| 2011/0197519 A1 | 8/2011 | Henriott et al. | |
| 2012/0251072 A1 | 10/2012 | Cope et al. | |
| 2014/0208626 A1 * | 7/2014 | Moon | G09F 15/0012 40/729 |
| 2014/0305015 A1 * | 10/2014 | Zelbacher | A47G 1/0622 40/714 |
| 2018/0157092 A1 * | 6/2018 | Jung | B32B 17/10036 |
| 2018/0350277 A1 | 12/2018 | Entwistle | |
| 2019/0180656 A1 * | 6/2019 | Entwistle | G09F 15/0018 |
| 2019/0221144 A1 * | 7/2019 | Artwohl | A47F 3/001 |
| 2019/0246816 A1 * | 8/2019 | Durrant | G09F 15/0018 |
| 2019/0367263 A1 | 12/2019 | Chabot | |
| 2020/0310487 A1 * | 10/2020 | Artwohl | G06F 1/1601 |

FOREIGN PATENT DOCUMENTS

| | | |
|---|---|---|
| CN | 103108146 A | 5/2013 |
| CN | 103422798 A | 12/2013 |
| DE | 20001923 U1 | 5/2000 |
| EP | 2230659 A1 | 9/2010 |
| GB | 2254551 A | 10/1992 |
| GB | 2549990 A | 11/2017 |
| GB | 2583060 A | 10/2020 |
| KR | 20090107741 A | 10/2009 |
| KR | 20110001438 A | 1/2011 |
| WO | 9743495 A1 | 11/1997 |
| WO | 9829623 A1 | 7/1998 |
| WO | 2007012196 A1 | 2/2007 |
| WO | 2008119142 A2 | 10/2008 |
| WO | 2017191440 A1 | 11/2017 |

OTHER PUBLICATIONS

Extended European Search Report for European Patent Application No. 21188592.6, dated Dec. 17, 2021, 9 pages.

* cited by examiner

Figure 1

(Prior Art)

Figure 2

(Prior Art)

DISPLAY UNIT

This application claims priority to United Kingdom Patent Application No. 2012039.0 filed on Aug. 3, 2020, wherein the entire contents of the foregoing application are hereby incorporated by reference herein.

The present invention relates to a display unit and particularly, but not exclusively, to a standalone display unit capable of housing ancillary equipment, such as associated computers, communication equipment, sound equipment or the like. The invention may be particularly applicable to a freestanding display unit, or at least a display unit which is capable of being freestanding.

There is a requirement, particularly in the corporate market, to have ever larger displays which may comprise different display panels or display boards, for example multiple flat panel displays, interlinked flat panel displays to function as one display or combinations of different display types, such as flat panel displays and interactive whiteboards for example. These will normally require to be adjacent one another and these will typically require a significant quantity of associated components, such as computers and communication devices, which are often discreetly housed adjacent to the displays. Alternatively, appropriate cabling may be provided between the display and remotely located ancillary equipment.

At present, relatively large displays may be constructed on site and may be secured to a frame mounted on a convenient wall, which in some cases may be a purpose built partition or dummy wall. Alternatively they may be built on a frame which is arranged not to be visible from behind the display.

An advantage of the above type of displays is that they can be configured to a specific requirement.

A disadvantage of such displays is that they are relatively permanent and thus it is difficult to move them from one location to another. They also often require a conventional wall or partition to which they may be secured, making it difficult to install them in many locations in modern open plan offices, or even partitioned areas, particularly if the partitions are glass partitions.

As an alternative to the above type of displays, there are available a number of self-contained display units which can be mounted on a wall or a stand. However, these are typically "off the shelf" units and cannot easily be manufactured to a specific customer's requirements or be reconfigured.

Figure 1:
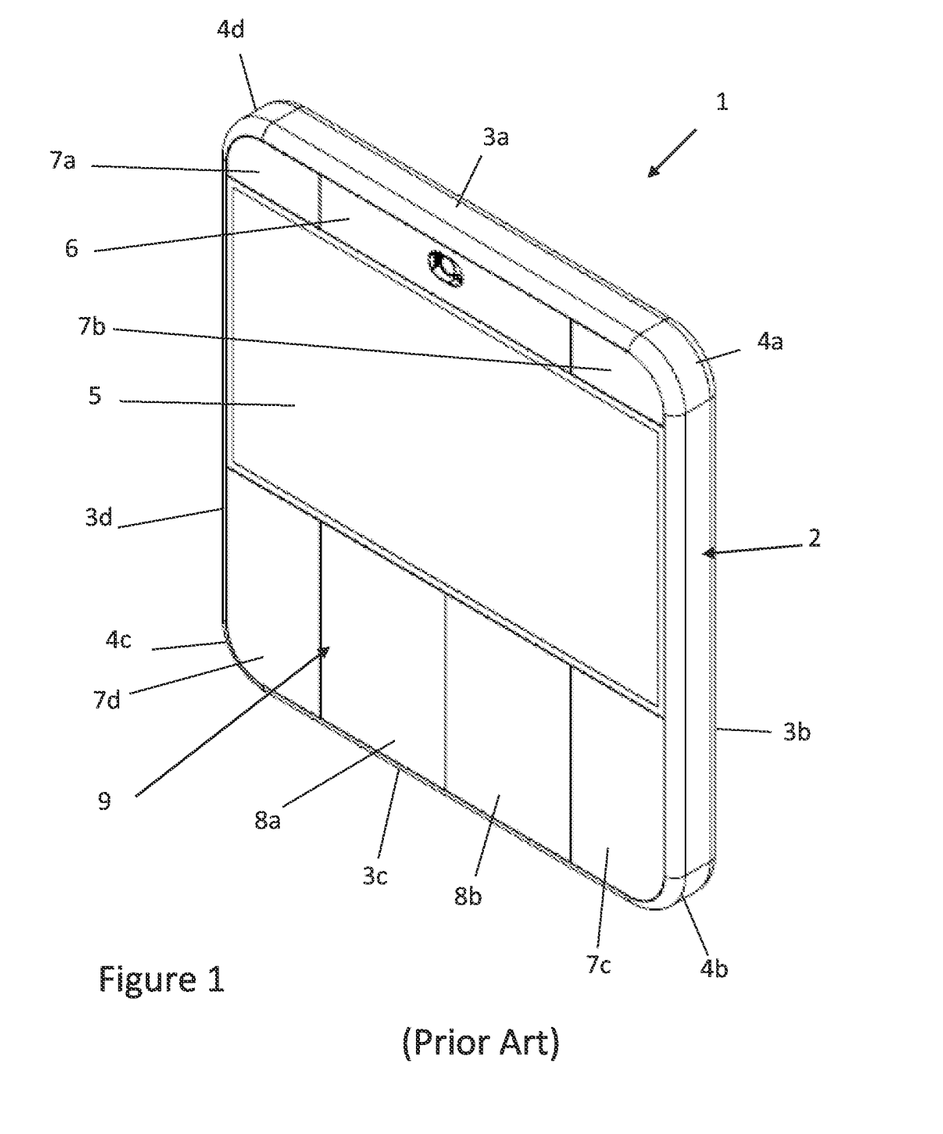
FIG. 1 is a perspective view of a known display unit disclosed in UK patent application publication number GB 2549990 A.

The applicant's earlier UK patent application, corresponding to publication number GB 2549990 A and filed 6 May 2016, discloses a display unit, shown in FIG. 1 of the present figures, which aims at addressing the above-mentioned issues. This provides a display unit which may be wall mounted or a free-standing unit, but which is a self-contained unit comprising a front face and a peripheral frame. The peripheral frame is formed from straight extruded sections joined by appropriate corner sections and the peripheral frame supports various components including those forming the front face of the display unit. The front face of the display unit comprises a display panel and possibly other components such as decorative panels which could for example be blanking panels or which may be mounted to front of cabinets for housing electrical equipment, or speaker panels and the like which may be associated with the display panel. As can be seen from the attached FIG. 1, the peripheral frame may not only support the components of the display unit, but it may also provide an attractive border around the display unit and around the front face of the display unit.

One problem which can be encountered when constructing display units of the above-mentioned type, is that the precise dimensions or shape of an edge of a component forming the front face of the display unit may not be precisely known when the peripheral frame, or kit to subsequently form the peripheral frame, is created. This is particularly the case with respect to display panels, where for example the display panel may be a standard "32 inch" display panel, but wherein the actual overall dimensions of that display panel will vary in dependence on the model and or manufacturer of the display panel. This may arise where the exact model of display panel is not known because this is to be subsequently specified by a customer, or because it is desired to produce a standard display unit capable of accommodating a range of "equivalent" display panels. In addition, it may be desired to subsequently replace or upgrade an initially installed display panel where the outer dimensions of an equivalent display panel may differ to those of the original.

It is an object of the present invention to provide an improved display unit.

According to a first aspect of the present invention there is provided a display unit comprising a front face and a peripheral frame, the peripheral frame forming a border around the front face, the front face comprising at least one display panel, wherein the peripheral frame comprises an extruded main section forming at least part of a main body of the peripheral frame, the main section having a channel formed therein extending longitudinally along its length, the peripheral frame further comprising at least one extruded auxiliary section having a profile in cross-section which engages with the channel in the main section of the peripheral frame, wherein the auxiliary section of the peripheral frame provides an infill between the main section and the front face of the display unit.

A display unit in accordance with the present invention permits a main body of a peripheral frame for the display unit to be constructed from one or more main sections of the peripheral frame, each cut to an appropriate length from an extrusion. Components forming the front face of that display unit can then fit snuggly within that frame, with one or more auxiliary sections being selected and fitted to form an infill between the main section of the peripheral frame and a component forming part of the front face of the display unit.

The use of the auxiliary sections is particularly an advantage because it permits a common extrusion to be used to form the main sections, thus the main body, of a peripheral frame and possibly many such peripheral frames, which extrusion will typically be expensive to tool up and to have extruded. This common extrusion may then be simply and conveniently modified, as required to fit with the components forming the front face of the display, by simply selecting an appropriate extruded auxiliary section and mounting this to the main section to extend that main section. The auxiliary section may in comparison be far cheaper to produce than the main section, both in respects of tooling and per unit length, the auxiliary section typically being far smaller in cross-sectional area and possibly being made of less expensive materials, for example the main section forming the main body of the peripheral frame may be formed of extruded aluminium, whereas the auxiliary section could be formed from extruded plastic, for example.

Preferably, the channel has a narrow neck portion and a wider main portion below the neck portion, wherein the cross-section of the auxiliary section is shaped so that a portion of the auxiliary section is retained in the channel by the narrow neck portion, retaining the auxiliary section in place on the main section of the peripheral frame. In this manner the auxiliary section may be fitted to a main section of the peripheral frame and retained in place along its length, enabling the channel to then retain the auxiliary section securely in place during subsequent assembly of the display unit and during the life of the display unit.

Preferably, the main section of the peripheral frame extends back from the front face of the display unit to form a side portion of the display unit, wherein the channel is formed towards a front edge of the main section in a surface of the main section facing inwardly towards the front face of the display unit, with the auxiliary section extending toward the front face of the display unit, wherein a front face of the auxiliary section is substantially parallel to the front face of the display. (For the avoidance of doubt, the reference above to "a side portion" encompasses any side of the display unit including the top side, left-hand side, right-hand side or bottom side, for example).

An advantage of the immediately above described arrangement is that a main section of the display unit may form a complete side face of the display unit, to provide a pleasing aesthetic effect without the use of any further components. Furthermore, with the auxiliary section being substantially parallel to the front face of the display, this may provide an almost seamless interface between a front edge of the peripheral frame and components forming the front face of the display unit, in a manner which may be aesthetically pleasing. It is therefore preferable that the front face of the auxiliary section abuts an edge of the components forming the front face of the display unit and is flush with the front face of those components, so that the auxiliary section effectively forms an extension of the front face.

Alternatively, the front face of the auxiliary section may be parallel to the front face of the display, but overlie an edge of the front face. This may be particularly the case where the auxiliary section is extruded from a metal or relatively rigid plastic, so that front face of the auxiliary section may be relatively thin and thus overlie an edge of the front face relatively seamlessly.

As an alternative to the above, the auxiliary section may be extruded from a compressible material which is compressed in a gap between the main section of the peripheral frame and the components forming the front face of the display unit.

The invention may find particularly application where the auxiliary section of the peripheral frame extends between the main section of the peripheral frame and a display panel forming part of the front face of the display unit. This is because this may then enable the auxiliary section of the peripheral frame to abut or overlie a display panel, enabling different models of equivalently sized display panels to be accommodate in a common main body of a peripheral frame.

Advantageously, the peripheral frame comprises a plurality of straight extruded main sections, of identical cross-section, joined directly or indirectly at their ends to form corners of the main body of the peripheral frame. In this manner, a peripheral frame can be constructed from lengths of a common extrusion, with possibly additional corner pieces only being required in order to join those lengths together in an aesthetically pleasing manner to provide a rectangular display unit.

A display unit as described above may comprise a plurality of auxiliary sections, each identical in cross-section and each retained in place in a channel of a respective main section of the peripheral frame to provide symmetry, to the display unit in an aesthetically pleasing manner.

Although the present application may have applications to display units other than the type disclosed in FIG. 1 and in the earlier application, publication number GB 2549990, the invention may be particularly applicable to display units of the type disclosed in that earlier application and similar display units. Here each main section of the peripheral frame has a plurality of additional spaced apart channels running longitudinally along its length, on an inward facing face, each additional channel, in cross-section, having a narrow neck portion and a wider main portion below the neck portion, the display unit further comprising a plurality of channel engaging members, each channel engaging member being slotted into a selected one of the additional channels and positioned in that additional channel at a desired location, the display unit further comprising a plurality of mountings anchored in desired locations to the peripheral frame by respective ones of the channel engaging members, wherein the mountings support, either directly or indirectly, the components forming the front face of the display unit.

The above embodiment of the present invention may be particularly advantageous, for it permits a relatively rigid and expensive extrusion to be formed and to be cut to form the main sections and main body of the peripheral frame. The main body of the peripheral frame may then be strong enough to provide a frame for supporting the components of the display, which peripheral frame enables mountings for those components to be provided at any desired location within the frame, by appropriate location of the channel engaging member in appropriate ones of the plurality of the spaced apart additional channels and at appropriate longitudinal positions within those channels. This thus provides a very flexible mounting arrangement for components of the display unit.

Such a standard extrusion, together with common channel engaging members and fixings, can then be used to form different configurations of display units having different components forming a front face of those display units. The provision of the relatively inexpensive auxiliary sections of the peripheral frame permits the relatively expensive main sections of the peripheral frame to then be tailored to fit with the components selected for the front face of the display unit. Furthermore, the auxiliary sections may be formed of a more flexible material than the rigid material required to form the main body of the peripheral frame, permitting the auxiliary sections to deform to provide a snug and possibly seamless fit to the components forming the front face of the display unit.

The main section of the peripheral frame may be substantially solid and have a flat inner face in which the plurality of the additional channels are formed to provide a flat, relatively rigid, surface to which the plurality of mountings may be clamped in position by the channel engaging members. This provides a very stable and rigid supporting surface for mounting components of the display unit, such as the display panel, which may be particularly important where the display unit is a freestanding unit, or is preassembled prior to being wall mounted.

According to a second aspect of the present invention there is provided a display system for forming a display unit as described above, the display system comprising a plurality of lengths of extruded main sections having identical cross-sections and which are arranged to be joined together, either directly or indirectly, to form a main body of a peripheral frame, the display system further comprising a plurality of sets of lengths of extruded auxiliary sections, each set comprising a plurality of lengths of auxiliary section each having an identical cross-section, with the lengths of each set having a different cross-section to those of the other sets, wherein each main section of the peripheral frame has a longitudinally extending channel formed therein, arranged to engage with and retain in place any one of the lengths of any set of auxiliary sections of the peripheral frame, to form an infill between a main section of the peripheral frame and a display unit mounted in the frame, wherein a respective set of lengths of auxiliary sections are arranged to be selected in dependence on the position of an edge of the display panel relative to the main section of the peripheral frame, or in dependence on the shape of an edge of the display panel.

This second aspect of the invention enables a plurality of extruded sections of different dimensions to be provided to form the auxiliary sections of a display unit, which may be selected in dependence on the particular components used to form the front face of a display unit.

According to a third aspect of the present invention there is provided a method of forming a display unit as described above, the method comprising, in no particular order, the steps of: cutting a plurality of lengths from a first extrusion to form a plurality of main sections of a peripheral frame; selecting a further extrusion from one of a plurality of further extrusions, which further extrusions are different to the first extrusion and to each other and cutting a plurality of lengths from the selected further extrusion to form a plurality of auxiliary sections of the peripheral frame; sliding or clipping each auxiliary section in to a channel in an associated main section; assembling the plurality of main sections to form a peripheral frame of a display unit; and assembling a display panel in the frame so that the display panel forms at least part of the front panel of the display unit, wherein the further extrusion, to form the auxiliary sections of the peripheral frame, is selected in dependence on the position, size or other features of the display panel and wherein at least one or more of the plurality of lengths from the selected further extrusion form an infill between the main body of the peripheral frame and the display panel.

According to a fourth aspect of the present invention there is provided an extruded main section for forming a peripheral frame of a display unit, the extruded main section comprising a plurality of spaced apart channels running longitudinal along its length on an inward facing face, each channel in cross-section having a narrow neck portion and a wider main portion below the neck portion, the channels being arranged to receive a plurality of channel engaging members slotted into a selected one of the channels and positioned to anchor a mounting for components of a display against the extruded main section, the main section of the peripheral frame comprising an additional channel extending from towards a front edge and arranged to receive an extruded auxiliary section to form part of a peripheral frame, to provide an infill between the main extruded section of and components of a display unit.

According to a fifth aspect of the present invention there is provided an extruded peripheral frame for a display unit comprising a main extruded section as described above and an extruded auxiliary section arranged to engage with and be retained in place by the additional channel to provide an infill between the extruded main section of the peripheral frame and components of a display unit.

The present invention will now be described, by way of example only, with reference to the accompanying figures, of which.

Referring to FIG. 1, this shows a known display unit, indicated generally as 1, as disclosed in the applicant's earlier UK patent application publication number GB 2549990 A. The display unit 1 comprises a peripheral frame, indicated generally 2, the peripheral frame 2 comprising four lengths of straight aluminium extruded sections 3a to 3d connected together to form the peripheral frame 2 by four corner pieces 4a to 4d. The display unit 1 further comprises a display panel 5, a speaker panel 6, blanking panels 7a to 7d and two storage cabinet facia panels 8a and 8b. The components forming the front face 9 of the display unit 1, namely the display panel 5, speaker panel 6, blanking panels 7a to 7d and the storage cabinet facia panels 8a to 8b, are flush with a front edge of the peripheral frame 2 to provide a particularly aesthetically pleasing look to the display unit 1.

Figure 2:
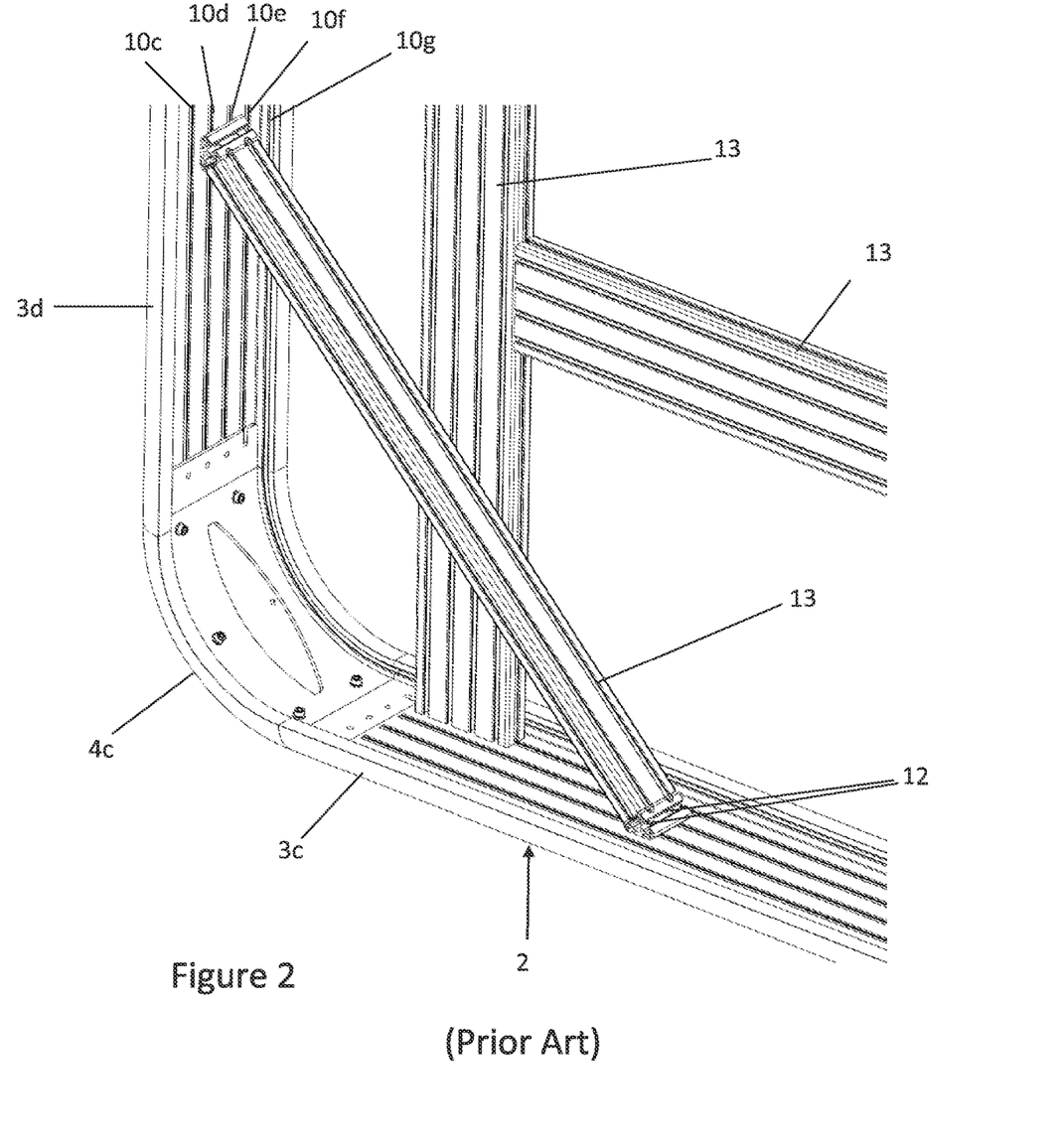
FIG. 2 is a perspective view of the peripheral frame and other frame components of the display unit of FIG. 1.

Referring to FIG. 2, this shows two of the aluminium extruded sections, 3c and 3d, of the peripheral frame 2 of FIG. 1 connected by a corner piece 4c. Each of the aluminium extruded sections 3c to 3d has a number of channels 10a to 10g formed on an internal surface (only channels 10c to 10g are visible in FIG. 2), which channels each have a narrow neck portion extending in from an inward facing face 11 of each aluminium extruded section 3c to 3d, which neck portion opens out into a wider main portion below the next portion. Into respective channels are inserted channel engaging members 12, to secure mountings 13 in a desired location, for securing the components forming the front face of the display, including the display panel 5. A significant feature of the peripheral frame 2 of FIGS. 1 and 2, is that the peripheral frame is a structural feature, supporting all the components of the display unit, with the aluminium extruded sections being substantially solid in nature defining a flat inward facing face 11 to which mountings 13 can be clamped by means of the channel engaging members 12.

Figure 3:
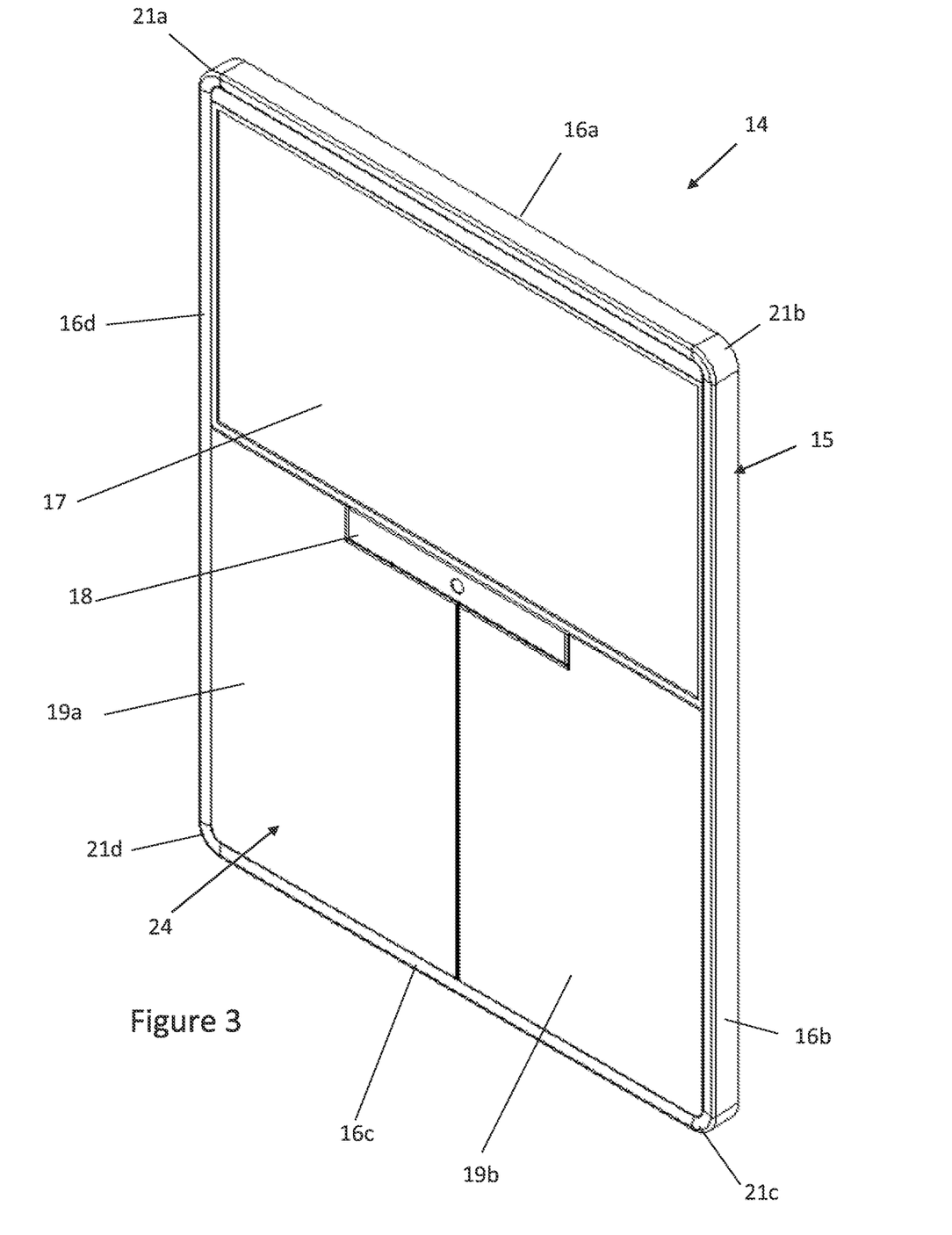
FIG. 3 is a perspective view of a display unit having a peripheral frame arranged to be modified to form a display unit in accordance with the present invention.

Referring now to FIG. 3, there is illustrated an alternative display unit, indicated generally as 14. This is constructed on the same principles as the display unit of FIGS. 1 and 2 and again comprises a peripheral frame 15 comprising four aluminium extruded sections 16a to 16d, a display panel 17, a speaker panel 18 and two storage cabinet facia panels 19a and 19b and blanking panel 20. The aluminium extruded sections 16a to 16d are joined at their corners by corner pieces 21a to 21d to provide a relatively rigid peripheral frame 15, similar to that previously described with reference to FIGS. 1 and 2.

Figures 4, 5:
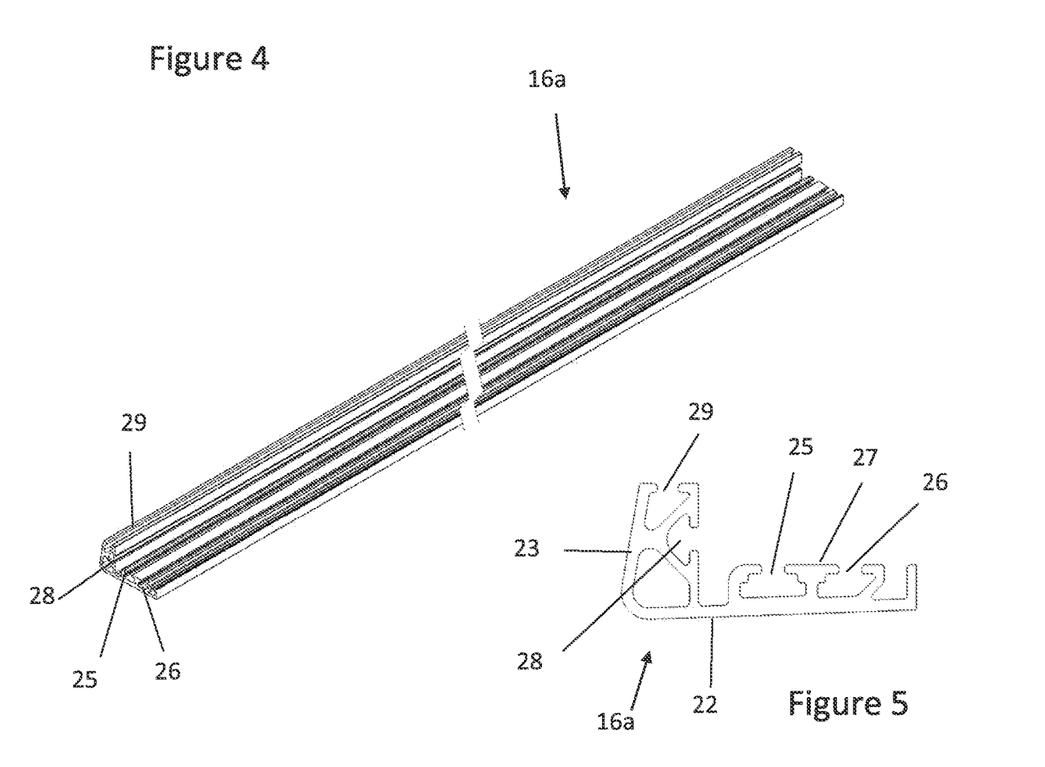
FIG. 4 is a perspective view of an extruded main section of the peripheral frame of the display unit of FIG. 3 for use in the present invention.
FIG. 5 is a cross-section through the main section of frame of FIG. 4.

Referring now to FIGS. 4 and 5, these show in perspective view and in cross-section respectively the aluminium extruded section 16a. This has a generally L-shaped cross-section, with the outer face 22 of the longer leg of the L defining a complete side (top side in the case of extruded section 16a) of the display unit 14 of FIG. 3, with the outer face 23 of the shorter leg of the L forming a face parallel to the front faces of the components defining a front face 24 of the display unit 14.

The peripheral frame 15 of the display unit 14 of FIG. 3 supports mountings for the components forming the front face 24 of the display unit 14, in the same manner as the peripheral frame 2 of FIGS. 1 and 2 supports the components forming the front face 9 of the display unit 1. The display unit 14 depicted in FIG. 3 is particularly slim and thus the peripheral frame 15 is also particularly slim, resulting in there only being two channels 25 and 26 in the flat inward facing face 27 of the aluminium extruded section 16a, as can be seen from FIGS. 4 and 5. However, in alternative embodiments, the peripheral frame 15 may be significantly wider, (see FIGS. 11 to 14 for example) and incorporate further channels.

The channels 25 and 26 are formed in the otherwise flat inwardly facing face 27 to which mountings, such as the mountings 13 described with reference to FIG. 2, or similar mountings, may be mounted by similar channel engaging members 12, so that the mountings 13 may support the components forming the front face 24 of the display unit 14 in the same manner as previously described.

Similar to the previous embodiment, the aluminium extruded section 16a may also comprise a further channel 28 formed in the back of the short leg of the L-shaped profile of the aluminium extruded sections 16a to 16d, which further channel 28 may also be used to secure appropriate mountings in place by use of appropriate channel engaging members 12.

Unlike the known previously described embodiments of FIGS. 1 and 2, the aluminium extruded sections 16a of FIGS. 4 and 5 (and thus all the extruded sections 16a to 16d) comprises an additional channel 29 formed in the distal end of the shorter leg of the L-shaped profile. In the display unit depicted in FIG. 3, this additional channel 29 serves no purpose. However, with reference to FIG. 6, where like components are indicated with like numerals to those used in FIG. 3, a different display panel 30 is mounted in the display unit 14, which display panel 30 is bordered by infill extrusions 31a to 31c. The infill extrusions 31a to 31c, described in more detail with reference to the subsequent figures, fill gaps between the display panel 30 and the peripheral frame 15, with the use of alternative infill extrusions permitting alternative display panels to be accommodated within the display unit 14, while providing an aesthetically pleasing, continuous and substantially flush front face 24 which extends to and includes the front face of the peripheral frame 15.

Figure 7:
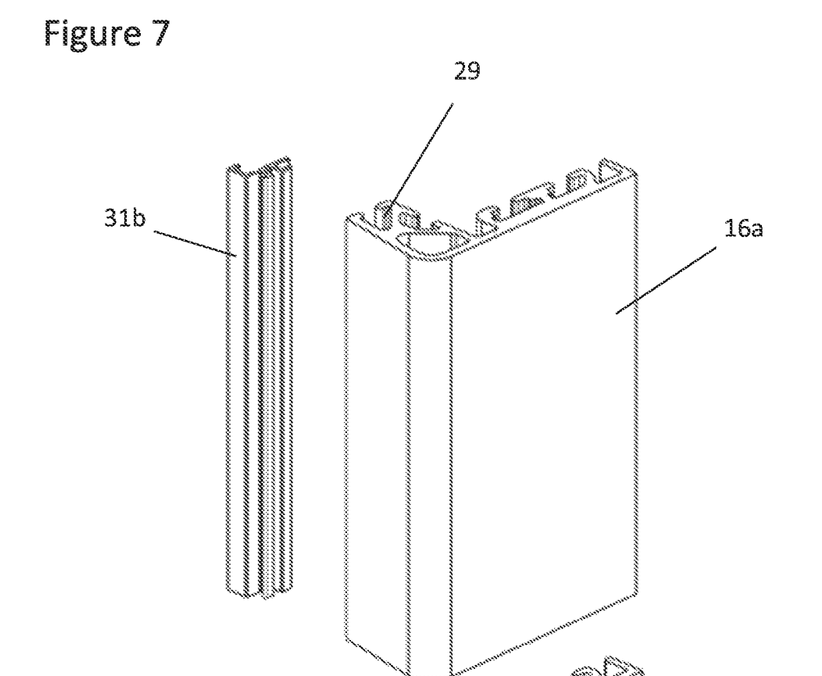
FIG. 7 is a perspective view showing a portion of the main section of a peripheral frame of FIGS. 4 and 5 and a portion of an auxiliary section of a peripheral frame prior to being fitted to the main section.

Referring now to FIG. 7, there is illustrated a portion of the aluminium extruded section 16a of FIGS. 3 to 5 and an infill extrusion 31b, prior to being inserted into the additional channel 29 of the aluminium extruded section 16a. The infill extrusion 31b, in this embodiment, is formed of a relatively rigid material and may be formed of aluminium, however as this is not a structural component it can alternatively be formed of a cheaper and easier to form plastic material and thus, because of its smaller dimensions and it being possibly fabricated of a plastic material, is less expensive per meter length than the aluminium extrusion 16a. This may permit a number of different type of infill extrusions to be manufactured, which may all be arranged to engage with the additional channel 29 in the aluminium extruded section 16a, such that an appropriate infill extrusion may be selected depending on the size of the gap between the aluminium extruded section 16a and an adjacent component of the front face 24 of the display unit 14, or alternatively the infill extrusion 31b may be omitted, as for example in the embodiment illustrated in FIG. 3.

Figure 6:
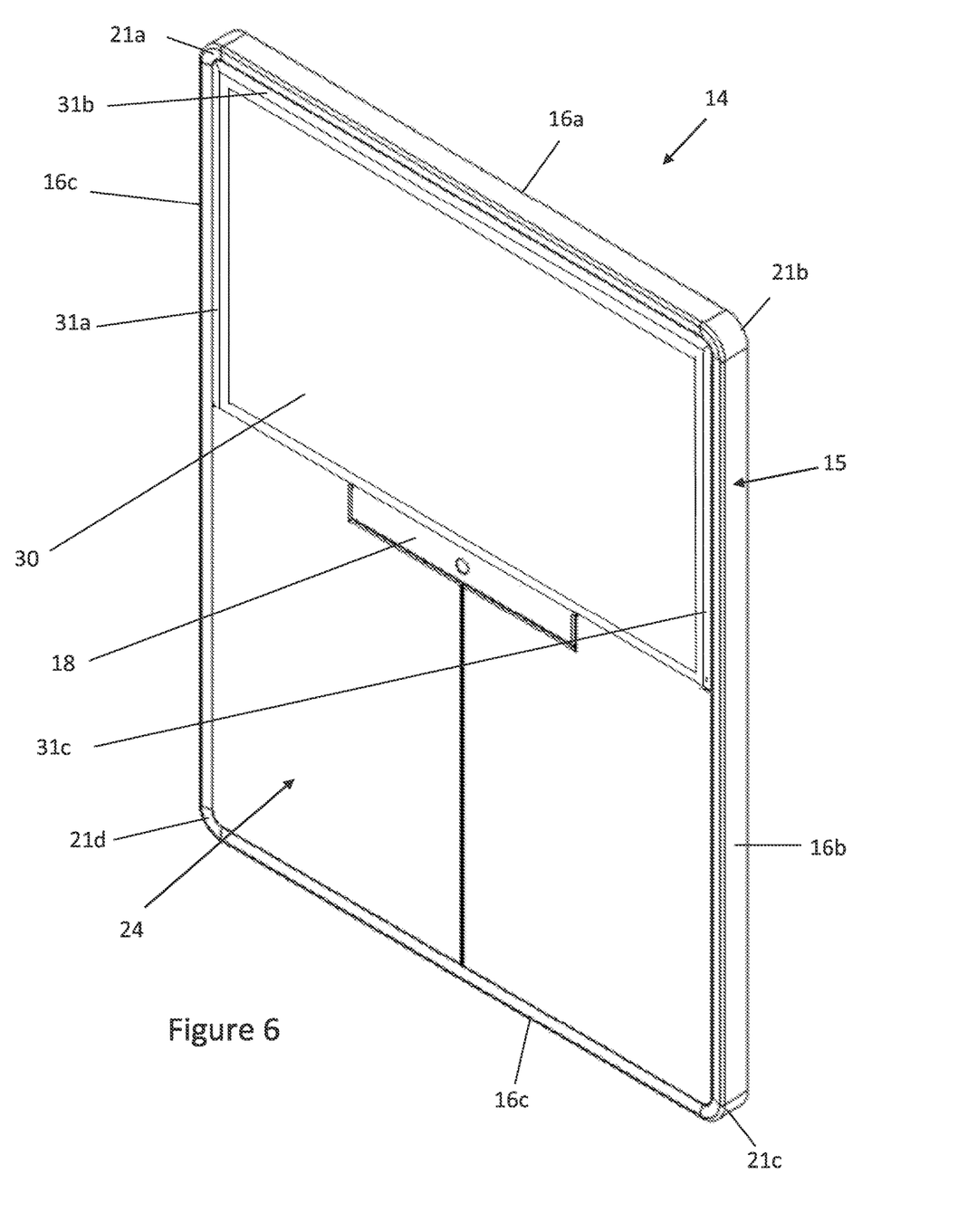
FIG. 6 is a perspective view of a display unit similar to that of FIG. 3, but incorporating an alternative display panel and with the peripheral frame of the display unit modified to form a display unit in accordance with the present invention.
Figure 8:
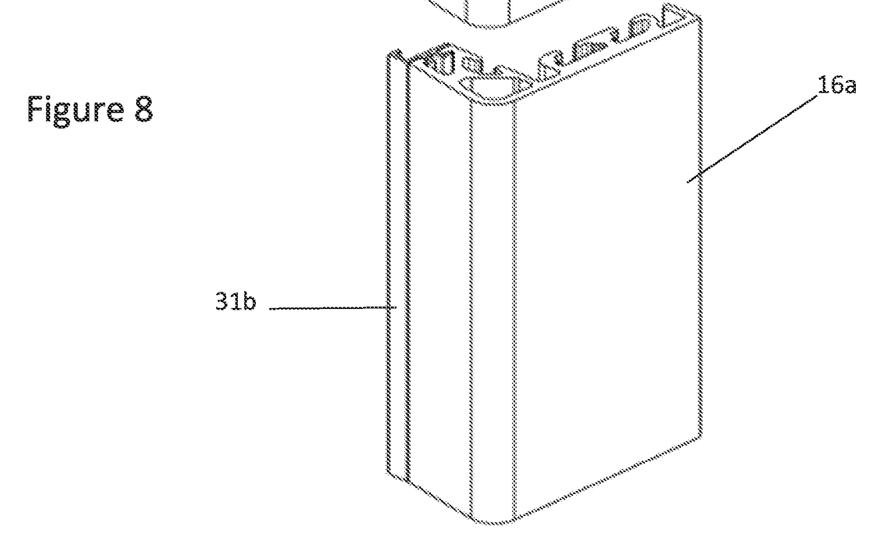
FIG. 8 corresponds to FIG. 7 but shows the auxiliary section fitted to the main section of the peripheral frame.

FIG. 8 shows the infill extrusion 31b retained in place in the aluminium extruded section 16a by the additional channel 29, into which the infill extrusion 31b may either be slid from one end, prior to assembly of the aluminium extruded sections 16a to 16d to form the peripheral frame 15, or which may be subsequently distorted and clipped into place using the resilience of the infill extrusion 31b, depending on the type of material used. An appropriate infill extrusion may thus be selected to bridge the gap and abut the edge of the display panel 30, as shown in FIG. 6.

Figure 9:
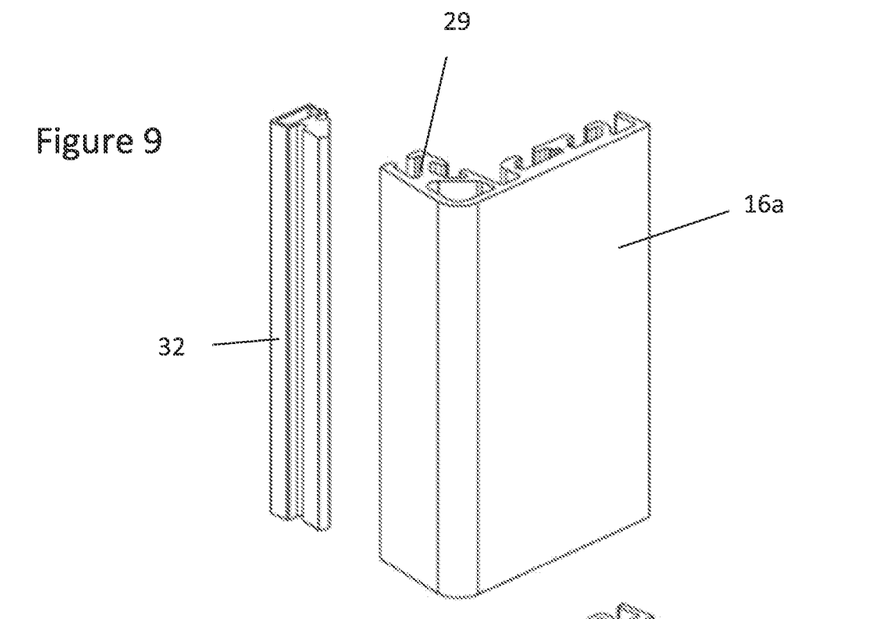
FIG. 9 corresponds to FIG. 7 but shows an alternative auxiliary section prior to being fitted to the main section of the peripheral frame.
Figure 10:
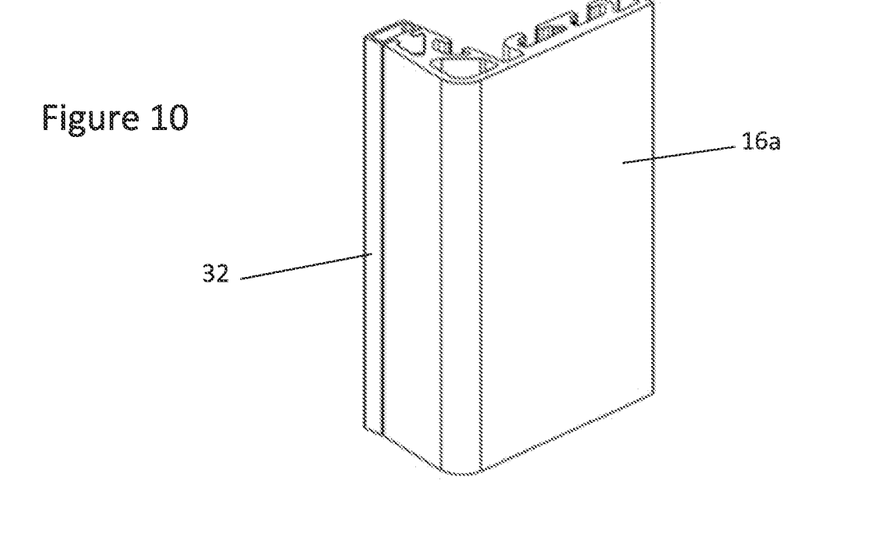
FIG. 10 corresponds to FIG. 9 but shows the auxiliary section fitted to the main section of the peripheral frame.

Referring now to FIGS. 9 and 10, these correspond essentially to FIGS. 7 and 8, but these show an alternative infill extrusion 32, which may function in a similar manner to the infill extrusion 31b previously described with reference to FIGS. 7 and 8. Similarly, FIGS. 11 and 12 essentially correspond to FIGS. 9 and 10 showing the same infill extrusion 32, but showing an alternative extruded aluminium section 33 for the peripheral frame.

Figure 11:
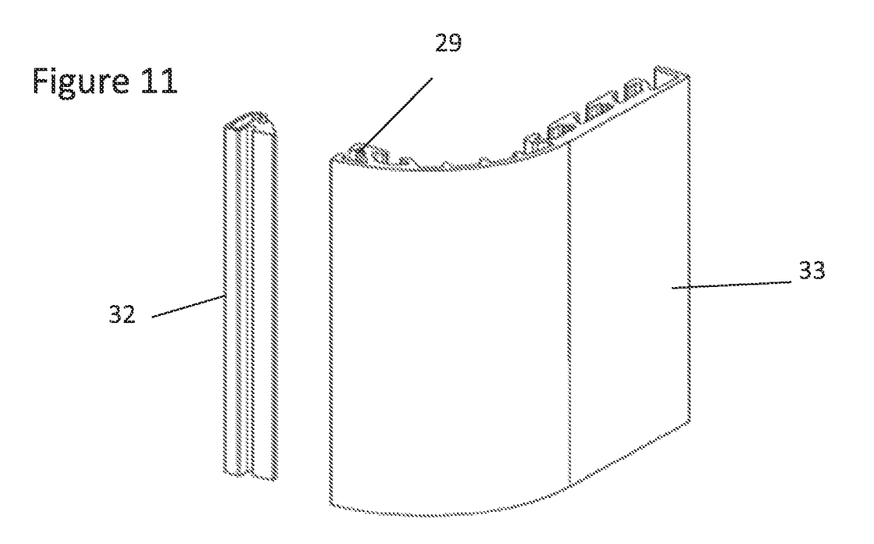
FIG. 11 corresponds to FIG. 9 but shows an alternative main section of the peripheral frame prior to being fitted to the auxiliary section of FIG. 9.
Figure 12:
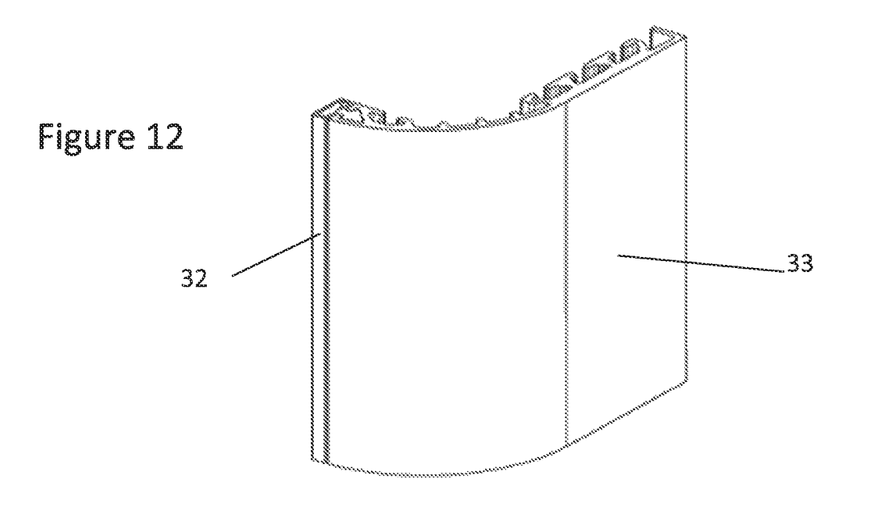
FIG. 12 corresponds to FIG. 11 but shows the auxiliary section fitted to the main section of the peripheral frame.
Figures 13, 14:
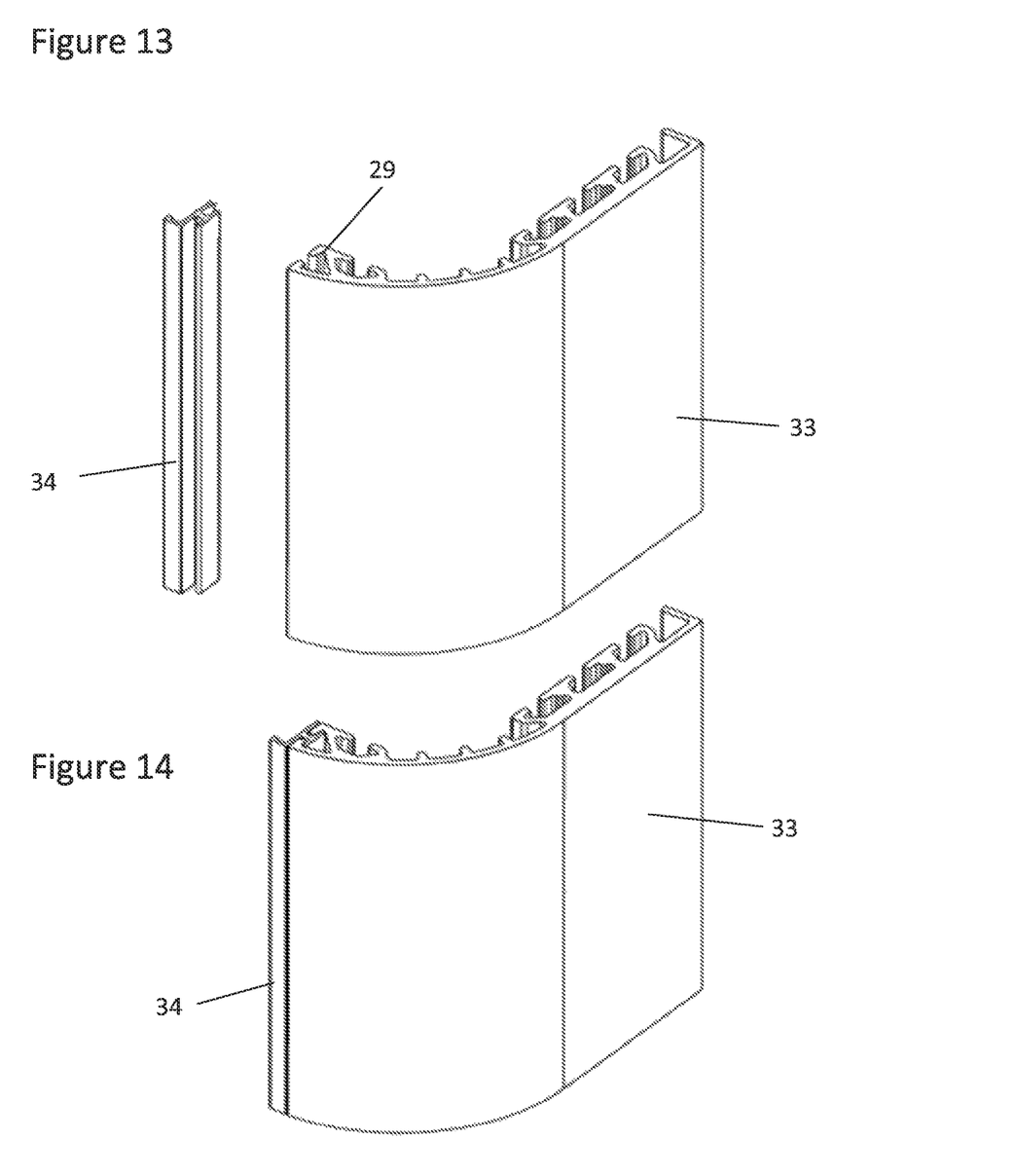
FIG. 13 corresponds to FIG. 11 but shows an alternative auxiliary section prior to being fitted to the main section of the peripheral frame.
FIG. 14 corresponds to FIG. 9 but shows the auxiliary section fitted to the main section of the peripheral frame.

Referring to FIGS. 13 and 14 these essentially correspond to FIGS. 11 and 12, showing the same extruded aluminium section 33, but showing a third alternative infill extrusion 34.

It will be appreciated that the infill extrusions of FIGS. 7, 8, 13 and 14 may be used to either abut a front edge of a display panel 30, or similar, or may be arranged to slightly overlap the front face of a display panel 30. In contrast, the infill extrusion 32 of FIGS. 9, 10, 11 and 12 may only abut a display panel 30, or similar. In this case it is preferable that the infill extrusion 32 be formed of a resilient and compressible material, such that it may abut a display panel 30 or similar and be held slightly in compression against that display panel by the peripheral frame 15.

A number of embodiments of the present invention have been described above, by way of example only, and it will be appreciated that many alternative embodiments will be apparent to the skilled person which may fall within the scope of the appended claims. Particularly it should be noted that the invention is not limited in any way to the particular materials disclosed in the description of the preferred embodiments, noting for example that the extruded section referred to as the "aluminium extruded section" could be formed of some other appropriate metal or material.

The invention claimed is:

1. A display unit comprising a front face and a peripheral frame, the peripheral frame forming a border around the front face, the front face comprising at least one display panel, wherein the peripheral frame comprises at least one extruded main section of the peripheral frame forming at least part of a main body of the peripheral frame, the at least one extruded main section of the peripheral frame having a channel formed therein extending longitudinally along its length, the peripheral frame further comprising at least one extruded auxiliary section having a profile in cross-section which engages with the channel in the at least one extruded main section of the peripheral frame, wherein the at least one extruded auxiliary section of the peripheral frame provides an infill between the at least one extruded main section of the peripheral frame and the front face of the display unit, wherein the at least one extruded main section of the peripheral frame extends to a side of the front face of the display unit to form a side portion of the display unit, wherein the channel is formed towards a front edge of the at least one extruded main section of the peripheral frame in a surface of the at least one extruded main section of the peripheral frame facing towards the front face, with the at least one extruded auxiliary section extending from the channel toward the front face of the display unit, and wherein a front face of the at least one extruded auxiliary section is parallel to the front face of the display unit.

2. The display unit of claim 1, wherein the channel has a narrow neck portion and a wider main portion below the neck portion and wherein the cross-section of the at least one extruded auxiliary section is shaped so that a portion of the at least one extruded auxiliary section is retained in the channel by the narrow neck portion, retaining the at least one extruded auxiliary section in place on the at least one extruded main section of the peripheral frame.

3. The display unit of claim 1, wherein the front face of the at least one extruded auxiliary section abuts an edge of the front face and is flush with the front face to effectively form an extension of the front face.

4. The display unit of claim 3, wherein the at least one extruded auxiliary section is extruded from a compressible material and is compressed in a gap between the at least one extruded main section of the peripheral frame and the front face of the display unit.

5. The display unit of claim 1, wherein the front face of the at least one extruded auxiliary section is parallel to the front face of the display unit and overlies an edge of the front face.

6. The display unit of claim 1, wherein the at least one extruded auxiliary section is extruded from metal or a rigid plastic.

7. The display unit of claim 1, wherein the at least one extruded auxiliary section of the peripheral frame extends between the at least one extruded main section of the peripheral frame and a display panel forming part of the front face of the display unit.

8. The display unit of claim 1, wherein the at least one extruded main section of the peripheral frame comprises a plurality of extruded main sections of the peripheral frame, that are straight and of identical cross-section, joined directly or indirectly at their ends to form corners of the main body of the peripheral frame.

9. The display unit of claim 8, wherein the at least one extruded auxiliary section comprises a plurality of extruded auxiliary sections, each identical in cross-section and each retained in place in a channel of a respective extruded main section of the peripheral frame.

10. The display unit of claim 8, wherein each extruded main section of the peripheral frame has a plurality of additional channels spaced apart from one another and running longitudinal along its length on an inward facing face, each additional channel, in cross-section, having a narrow neck portion and a wider main portion below the neck portion, the display unit further comprising a plurality of channel engaging members, each channel engaging member being slotted into a selected one of the additional channels and positioned in that additional channel at a desired location, the display unit further comprising a plurality of mountings anchored in desired locations to the peripheral frame by respective ones of the channel engaging members, wherein the plurality of mountings support, either directly or indirectly, components forming the front face of the display unit.

11. The display unit of claim 10, wherein the plurality of mountings support the at least one display panel.

12. The display unit of claim 10, wherein each extruded main section of the peripheral frame is substantially solid and has a flat inner face in which the plurality of the additional channels are formed to provide a flat, relatively rigid, surface to which the plurality of mountings may be clamped in position by the channel engaging members.

13. A display system for forming in the display unit of claim 1, the display system comprising a plurality of lengths of the at least one extruded main section of the peripheral frame having an identical cross-sections and which are arranged to be joined together, either directly or indirectly, to form a main body of a peripheral frame, the display system further comprising a plurality of sets of lengths of extruded auxiliary sections each set comprising a plurality of lengths of extruded auxiliary section each having an identical cross-section, with the lengths of each set having a different cross-section to those of other sets, wherein each extruded main section of the peripheral frame has a longitudinally extending channel formed therein, arranged to engage with and retain in place any one of the lengths of any set of auxiliary sections of the peripheral frame, to form an infill between the extruded main section of the peripheral frame and the display unit mounted in the frame, wherein a respective set of lengths of auxiliary sections are arranged to be selected in dependence on the position of an edge of the display panel relative to the extruded main section of the peripheral frame, or in dependence on the shape of an edge of the display panel.

14. A method of forming the display unit of claim 1, the method comprising, in no particular order, the steps of:
cutting a plurality of lengths from a first extrusion to form a plurality of extruded main sections of the peripheral frame;
selecting a further extrusion from one of a plurality of further extrusions, which further extrusions are different to the first extrusion and to each other and cutting a plurality of lengths from the selected further extrusion to form a plurality of auxiliary sections of the peripheral frame;
sliding each auxiliary section into a channel in an associated extruded main section of the peripheral frame;
assembling the plurality of extruded main sections of the peripheral frame to form a peripheral frame of the display unit; and
assembling the display panel in the frame so that the display panel forms at least part of the front panel of the display unit,
wherein the further extrusion, to form the auxiliary sections of the peripheral frame, is selected in dependence on the position, size or other features of the display panel, and wherein at least one or more of the plurality of lengths from the selected further extrusion form an infill between the main body of the peripheral frame and the display panel.

15. An extruded main section of the peripheral frame for forming a peripheral frame of a display unit, having a front face surrounded by said peripheral frame, wherein the extruded main section of the peripheral frame comprises a plurality of spaced apart channels running longitudinal along its length on an inward facing face, each channel in cross-section having a narrow neck portion and a wider main portion below the neck portion, the channels being arranged to receive a plurality of channel engaging members slotted into a selected one of the channels and positioned to anchor a mounting for components of the display unit against the extruded main section of the peripheral frame, the extruded main section of the peripheral frame comprising an additional channel extending towards a front edge and facing towards the front face, the additional channel being arranged to receive an extruded auxiliary section to form part of the peripheral frame, to provide an infill between the extruded main section of the peripheral frame and components of the display unit.

16. An extruded peripheral frame for the display unit, the extruded peripheral frame comprising the extruded main section of the peripheral frame of claim 15 and the extruded auxiliary section arranged to engage with and be retained in place by the additional channel to provide an infill between the extruded main section of the peripheral frame and components of the display unit.

* * * * *